(12) United States Patent
Talledo

(10) Patent No.: US 12,494,442 B2
(45) Date of Patent: Dec. 9, 2025

(54) LEADFRAME WITH VARYING THICKNESSES AND METHOD OF MANUFACTURING SEMICONDUCTOR PACKAGES

(71) Applicant: STMICROELECTRONICS, INC., Calamba (PH)

(72) Inventor: Jefferson Sismundo Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 573 days.

(21) Appl. No.: 17/889,251

(22) Filed: Aug. 16, 2022

(65) Prior Publication Data

US 2023/0068273 A1    Mar. 2, 2023

Related U.S. Application Data

(60) Provisional application No. 63/237,004, filed on Aug. 25, 2021.

(51) Int. Cl.
| | | |
|---|---|---|
| *H01L 23/00* | (2006.01) | |
| *H01L 21/48* | (2006.01) | |
| *H01L 21/56* | (2006.01) | |
| *H01L 23/31* | (2006.01) | |
| *H01L 23/495* | (2006.01) | |

(52) U.S. Cl.
CPC ........ *H01L 23/562* (2013.01); *H01L 21/4825* (2013.01); *H01L 21/565* (2013.01); *H01L 23/3107* (2013.01); *H01L 23/49513* (2013.01); *H01L 23/4952* (2013.01); *H01L 23/49548* (2013.01)

(58) Field of Classification Search
CPC .............. H01L 23/562; H01L 23/3107; H01L 23/49513; H01L 23/4952; H01L 23/49548; H01L 21/565; H01L 21/4825
See application file for complete search history.

(56) References Cited

U.S. PATENT DOCUMENTS

| | | | |
|---|---|---|---|
| 6,605,865 B2 | 8/2003 | Jeong et al. | |
| 6,841,854 B2* | 1/2005 | Itou .................... | H01L 23/49548 257/676 |
| 7,259,451 B2 | 8/2007 | Seng et al. | |
| 7,405,468 B2* | 7/2008 | Masuda ............ | H01L 23/49551 257/E23.047 |

(Continued)

*Primary Examiner* — Nathan W Ha
(74) *Attorney, Agent, or Firm* — Seed IP Law Group LLP

(57) ABSTRACT

The present disclosure is directed to semiconductor packages manufactured utilizing a leadframe with varying thicknesses. The leadframe with varying thicknesses has a reduced likelihood of deformation while being handled during the manufacturing of the semiconductor packages as well as when being handled during a shipping process. The method of manufacturing is not required to utilize a leadframe tape based on the leadframe with varying thicknesses. This reduces the overall manufacturing costs of the semiconductor packages due to the reduced materials and steps in manufacturing the semiconductor packages as compared to a method that utilizes a leadframe tape to support a leadframe. The semiconductor packages may include leads of varying thicknesses formed by utilizing the leadframe of varying thicknesses to manufacture the semiconductor packages.

20 Claims, 6 Drawing Sheets

(56) References Cited

U.S. PATENT DOCUMENTS

| | | | |
|---|---|---|---|
| 7,687,893 B2* | 3/2010 | Smith | H01L 23/4951 |
| | | | 257/676 |
| 8,299,602 B1* | 10/2012 | Choi | H01L 24/49 |
| | | | 257/E23.047 |
| 9,859,196 B2 | 1/2018 | Luan | |
| 9,892,997 B2 | 2/2018 | Lin et al. | |
| 9,972,558 B1* | 5/2018 | Talledo | H01L 24/11 |
| 10,199,312 B1 | 2/2019 | Rivera-Marty | |
| 2005/0093117 A1* | 5/2005 | Masuda | H01L 21/565 |
| | | | 257/E23.047 |
| 2007/0052070 A1* | 3/2007 | Islam | H01L 24/97 |
| | | | 257/E23.037 |
| 2016/0056097 A1 | 2/2016 | Bai et al. | |
| 2018/0286789 A1 | 10/2018 | Talledo et al. | |
| 2021/0090979 A1 | 3/2021 | Macheiner | |
| 2022/0115301 A1* | 4/2022 | Bowers | H01L 24/83 |

* cited by examiner

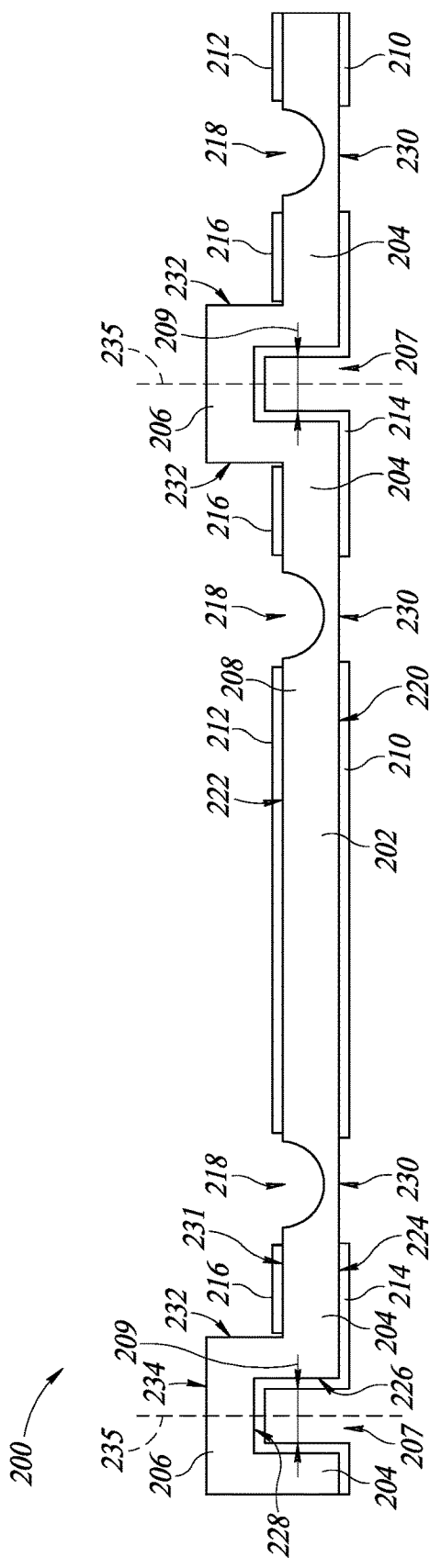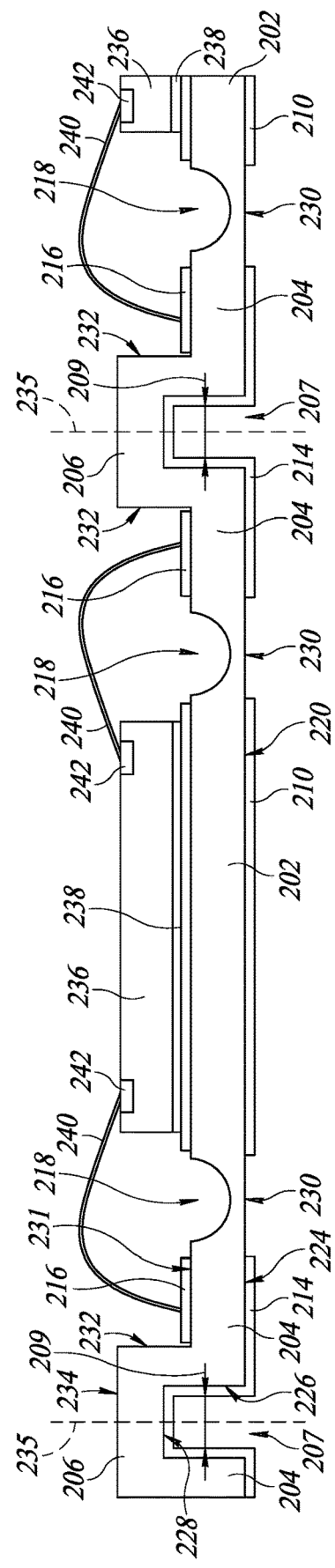
FIG. 2A
FIG. 2B

LEADFRAME WITH VARYING THICKNESSES AND METHOD OF MANUFACTURING SEMICONDUCTOR PACKAGES

BACKGROUND

Technical Field

The present disclosure is directed to semiconductor packages formed utilizing a leadframe with varying thicknesses.

Description of the Related Art

Generally, methods of forming conventional semiconductor packages includes utilizing a leadframe to form conductive components (e.g., bus bars, die pads, leads, etc.) within the conventional semiconductor packages. For example, conventional semiconductor packages may be formed by coupling a plurality of semiconductor die to die pad portions (e.g., portions that will become die pads of singulated ones of the conventional semiconductor packages) of the leadframe. After coupling the plurality of die to the die pad portions, a plurality of electrical wires may be formed by a bond and stitch technique to couple contact pads at respective active surfaces of the plurality of die to respective ones of a plurality of lead portions (e.g., portions that will become leads of singulated ones of the conventional semiconductor packages) of the leadframe. After the electrical wires are formed, a molding compound may be formed utilizing a mold tool to cover the plurality of die, the plurality of leads, the plurality of die pads, and the plurality of electrical wires. The electrical wires may be embedded or encased with the molding compound. After forming the molding compound, the leadframe and the molding compound are singulated along saw lines (e.g., kerf lines) to form singulated (e.g., individual ones) of conventional semiconductor device packages.

As the method of forming the conventional semiconductor packages includes the leadframes, an overall thickness of the conventional semiconductor packages may be limited in being reduced as well. For example, the leadframes may be limited in being reduced in thickness as the leadframes need to be thick enough to avoid deformation while the leadframes are being handled during shipping and manufacturing. This limited reduction in thickness of the leadframes limits the amount thicknesses of conventional semiconductor packages may be reduced.

BRIEF SUMMARY

The present disclosure is directed to forming semiconductor packages utilizing a leadframe with varying thicknesses (e.g., a first thickness at first locations and a second thickness at second locations). The leadframe is thicker at the second locations to improve the leadframe's resistance and robustness against external stresses and forces that may result in the leadframe deforming while being handled during a method of manufacturing or during shipping.

As discussed earlier, the limited reduction in thicknesses of leadframes limits the amount thicknesses of conventional semiconductor packages may be reduced such that the overall thicknesses of the conventional semiconductor packages are generally greater than the overall thickness of embodiments of the semiconductor package of the present disclosure utilizing a leadframe with varying thicknesses.

In at least one embodiment, a semiconductor package of the present disclosure includes a leadframe including a die pad having a surface and a lead having a first layer. A first portion of the first layer extends in a first direction. A second portion of the first layer extends away from the first portion in a second direction transverse to the first portion. A third portion of the first layer extends away from the second portion in the first direction. The first layer of the lead includes a first internal surface and a first external surface extending in the first direction, and the first portion of the first layer being between the first internal surface and the first external surface. The first layer of the lead further includes a second internal surface and a second external surface extending in the second direction, and the second portion being between the second internal surface and the second external surface. The first layer further includes a third internal surface and a third external surface extending in the first direction, and the third portion being between the third internal surface and the third external surface. A first end surface of the first layer extends in the first direction from the third internal surface and the third external surface. The semiconductor package further includes a die coupled to the surface of the die pad by an adhesive, and a molding compound covering the first internal surface, the second internal surface, and the third internal surface. The molding compound including a sidewall surface substantially coplanar with the first end surface of the first layer.

The present disclosure further includes at least one embodiment of a method of manufacturing the at least one embodiment of the semiconductor package as described above. For example, the method of manufacturing of the at least one embodiment of the semiconductor package may include forming a plurality of layers lining surfaces of a first layer of the leadframe. After forming the plurality of layers, a die is coupled to a die pad portion of the leadframe and a plurality of electrical wires are formed coupling the die to a plurality of lead portions of the leadframe. After coupling the die to the die pad and forming the plurality of electrical wires, a molding compound is formed covering the leadframe, covering ones of the plurality of layers, covering the die, and covering the plurality of electrical wires. After the molding compound has been formed, the leadframe, the molding compound, and ones of the plurality of layers are singulated along recesses within the leadframe forming individual ones of the at least one embodiment of the semiconductor package.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify the same or similar elements or acts unless the context indicates otherwise. The sizes and relative proportions of the elements in the drawings are not necessarily drawn to scale. For example, some of these elements may be enlarged and positioned to improve drawing legibility.

FIGS. 2A-2E are cross-sectional views directed to a method of manufacturing the embodiment of the semiconductor package as shown in FIGS. 1A-1C.

DETAILED DESCRIPTION

Figure 1A:
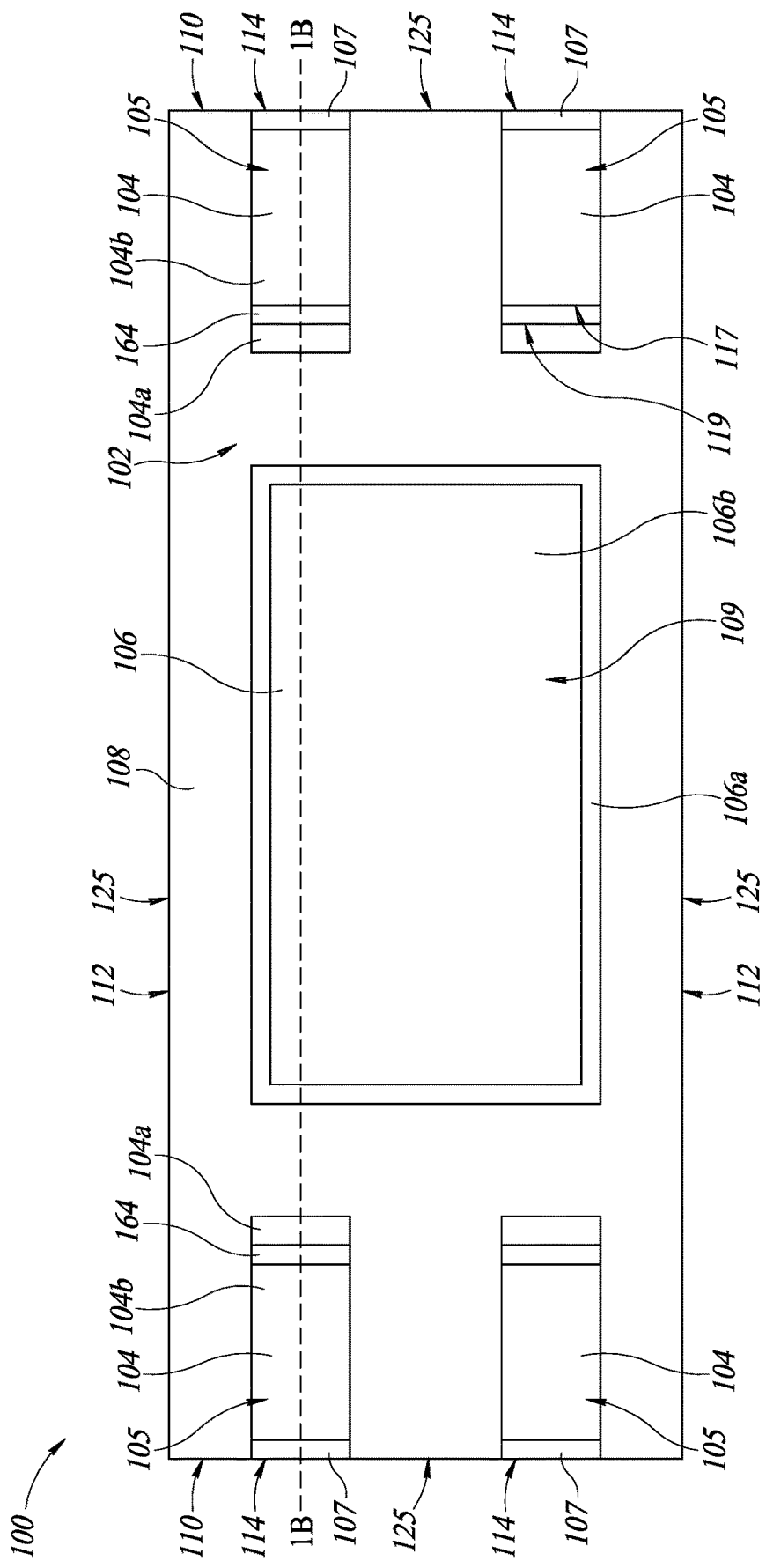
FIG. 1A is directed to a bottom plan view of an embodiment of a semiconductor package of the present disclosure.

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "top," "bottom," "upper," "lower," "left," and "right," are used for only discussion purposes based on the orientation of the components in the discussion of the figures in the present disclosure as follows. These terms are not limiting as to the possible positions explicitly disclosed, implicitly disclosed, or inherently disclosed in the present disclosure.

The term "substantially" is used to clarify that there may be slight differences and variations when a package is manufactured in the real world, as nothing can be made perfectly equal or perfectly the same. In other words, "substantially" means and represents that there may be some slight variation in actual practice and instead is made or manufactured within selected tolerances.

As used in this specification and the appended claims, the singular forms "a," "an," and "the" include plural referents unless the content clearly dictates otherwise.

While an embodiment of a semiconductor package is shown and described within the present disclosure, it will be readily appreciated that embodiments are not limited thereto. In various embodiments, the structures, devices, methods and the like described herein may be embodied in or otherwise utilized in any suitable type or form of semiconductor packages, and may be manufactured utilizing any suitable semiconductor die and packaging technologies.

Generally, conventional semiconductor packages include leads and a die pad that were formed utilizing a conventional leadframe having a thickness that remains substantially the same along an entire length of the conventional leadframe. These conventional leadframes are reduced in thickness as much as possible to reduce an overall thickness of the conventional semiconductor packages. However, these conventional leadframes are limited in the amount that their thickness may be reduced as reducing the thicknesses of the conventional leadframes increases the likelihood of deformation of the conventional leadframes while being handled during manufacturing or shipping. In other words, the conventional leadframes may only be reduced in thickness to a certain point to balance the likelihood of deformation and reducing the overall thickness of the conventional semiconductor packages. For example, to reduce the likelihood of deformation, the conventional leadframes may be increased in thickness but this would increase the overall thicknesses of the conventional semiconductor packages, and, alternatively, the conventional leadframes may be reduced in thickness but this would increase the likelihood of deformation during handling in a manufacturing process, a shipping process, or both.

In order to reduce the likelihood of deformation of the conventional leadframe, a support tape may be coupled to a surface of the conventional leadframe. However, the support tape results in additional costs of manufacturing the conventional semiconductor packages as compared to manufacturing the at least one embodiment of the semiconductor package of the present disclosure. For example, when manufacturing the at least one embodiment of the semiconductor package of the present disclosure, the leadframe with varying thicknesses may not be coupled to a support tape as the leadframe is not likely to be deformed when being handled during manufacturing and shipment unlike the conventional leadframe utilized to manufacture the conventional semiconductor packages. By not having to utilize the support tape to support the leadframe of varying thicknesses of the present disclosure, the costs of manufacturing the at least one embodiment of the semiconductor package of the present disclosure may be less than the costs of manufacturing the conventional semiconductor packages.

In at least one embodiment, the semiconductor package of the present disclosure may be relatively thinner than the conventional semiconductor packages as the at least one embodiment of the semiconductor package of the present disclosure is manufactured utilizing a leadframe with varying thicknesses. The utilization of the leadframe with varying thicknesses allows for the at least one embodiment of the semiconductor package of the present disclosure to be manufactured relatively thinner than the conventional semiconductor packages. It will become readily apparent that an overall thickness of the at least one embodiment of the semiconductor package of the present disclosure will be less than the overall thickness of the conventional semiconductor packages.

FIG. 1A is directed to a bottom plan view of a semiconductor package 100. A surface 102 (e.g., bottom surface) of the semiconductor package 100 is readily visible in FIG. 1A.

The semiconductor package 100 includes a plurality of leads 104 and a die pad 106 that are exposed from a molding compound 108 in which the plurality of leads 104 and the die pad 106 are present. The molding compound 108 may be an epoxy, a resin, or some other type of non-conductive material in which the plurality of leads 104 and the die pad 106 are present. The plurality of leads 104 include exposed surfaces 105 and lip portions 107 exposed from the molding compound 108, which may be readily visible in FIG. 1B. The die pad 106 includes an exposed surface 109 exposed from the molding compound 108. The surface 102 of the semiconductor package 100 may be a surface of the molding compound 108.

The exposed surfaces 105, 109 of the plurality of leads 104 and the die pad 106, respectively, may be utilized for mounting the semiconductor package 100 to another electronic component. For example, a solder material, which may be in the form of solder balls, may be coupled to the exposed surfaces 105, 109 of the plurality of leads 104 and the die pad 106, and then the solder material may be reflowed to couple the semiconductor package 100 to a printed circuit board (PCB).

The semiconductor package 100 further includes first sidewalls 110 and second sidewalls 112. The first sidewalls 110 extend between opposite ones of the second sidewalls 112, and the second sidewalls 112 extend between opposite ones of the first sidewalls 110. For example, the first sidewall 110 at the left-hand side of the semiconductor package 100 extends from the second sidewall 112 at the lower side of the semiconductor package 100 to the second sidewall 112 at the upper side of the semiconductor package 100. Similarly, the second sidewall 112 at the upper side of the semiconductor package 100 extends from the first sidewall 110 at the left-hand side of the semiconductor package 100 to the first sidewall 110 at the right-hand side of the semiconductor package 100. The first sidewalls 110 are shorter in length than the second sidewalls 112. The first sidewalls 110 are transverse to the second sidewalls 112 and vice versa.

Ones of the plurality of leads 104 are present at the first sidewalls. For example, in this embodiment of the semiconductor package 100, two of the plurality of leads 104 are present at the first sidewall 110 at the left-hand side of the semiconductor package 100, and two other ones of the plurality of leads 104 are present at the first sidewall 110 at the right-hand side of the semiconductor package 100.

The first sidewalls 110 include sidewalls 125 of the molding compound 108 and sidewalls 114 of the plurality of leads 104 that are substantially coplanar and substantially flush with each other. In other words, the first sidewalls 110 of the semiconductor package 100 are defined by the sidewalls 114 of the plurality of leads 104 and the sidewalls 125 of the molding compound 108.

In this embodiment, the semiconductor package 100 has a substantially rectangular profile when viewed in the bottom plan view as shown in FIG. 1A. In this embodiment, the second sidewalls 112 are longer than the first sidewalls 110 as shown in the bottom plan view and the top plan view of FIGS. 1A and 1C, respectively. However, in some embodiments, the semiconductor package 100 may have a substantially square profile in which the lengths of the first sidewalls 110 and the second sidewalls 112 would be substantially equal to each other.

In this embodiment, the plurality of leads 104 are present at the first sidewalls 110 of the semiconductor package 100. However, in some embodiments, ones of the plurality of leads 104 may be present along the second sidewalls 112 of the semiconductor package 100 and other ones of the plurality of leads 104 may be present along the first sidewalls 110 as well.

Figure 1B:
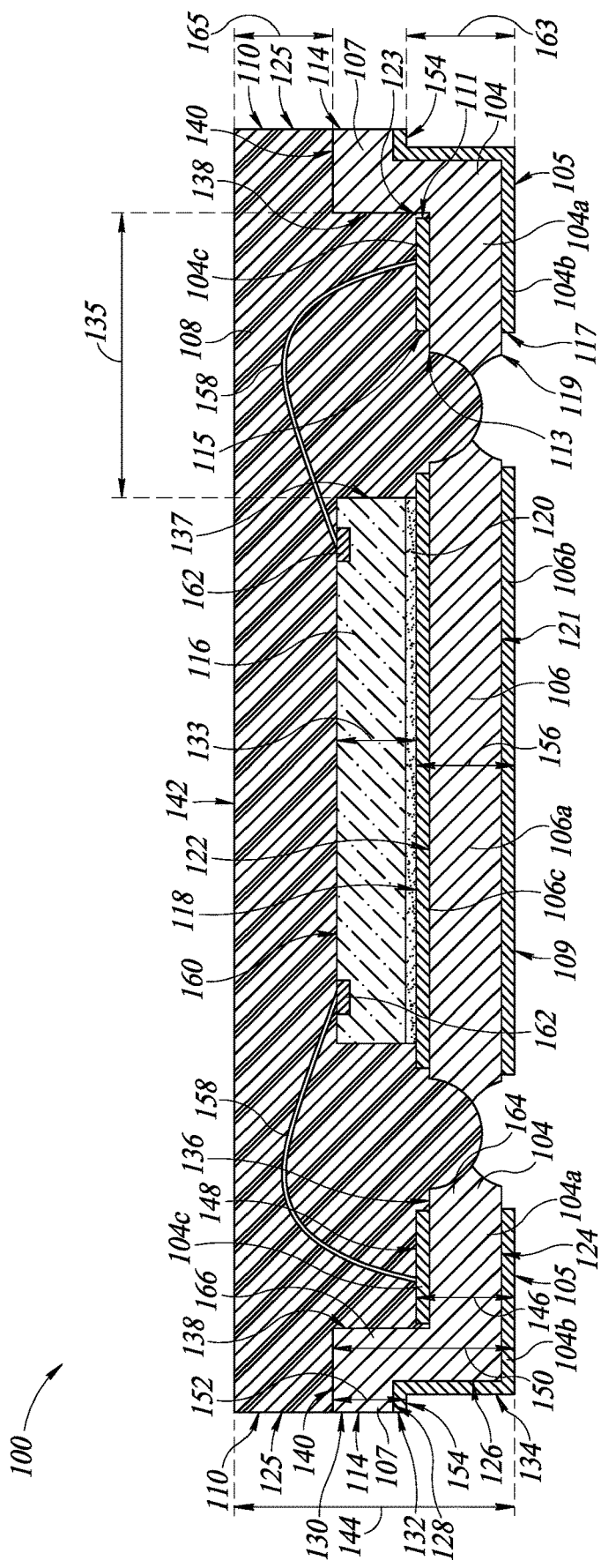
FIG. 1B is directed to a cross-sectional view of the embodiment of the semiconductor package taken along line 1B-1B in FIG. 1A.
Figure 1C:
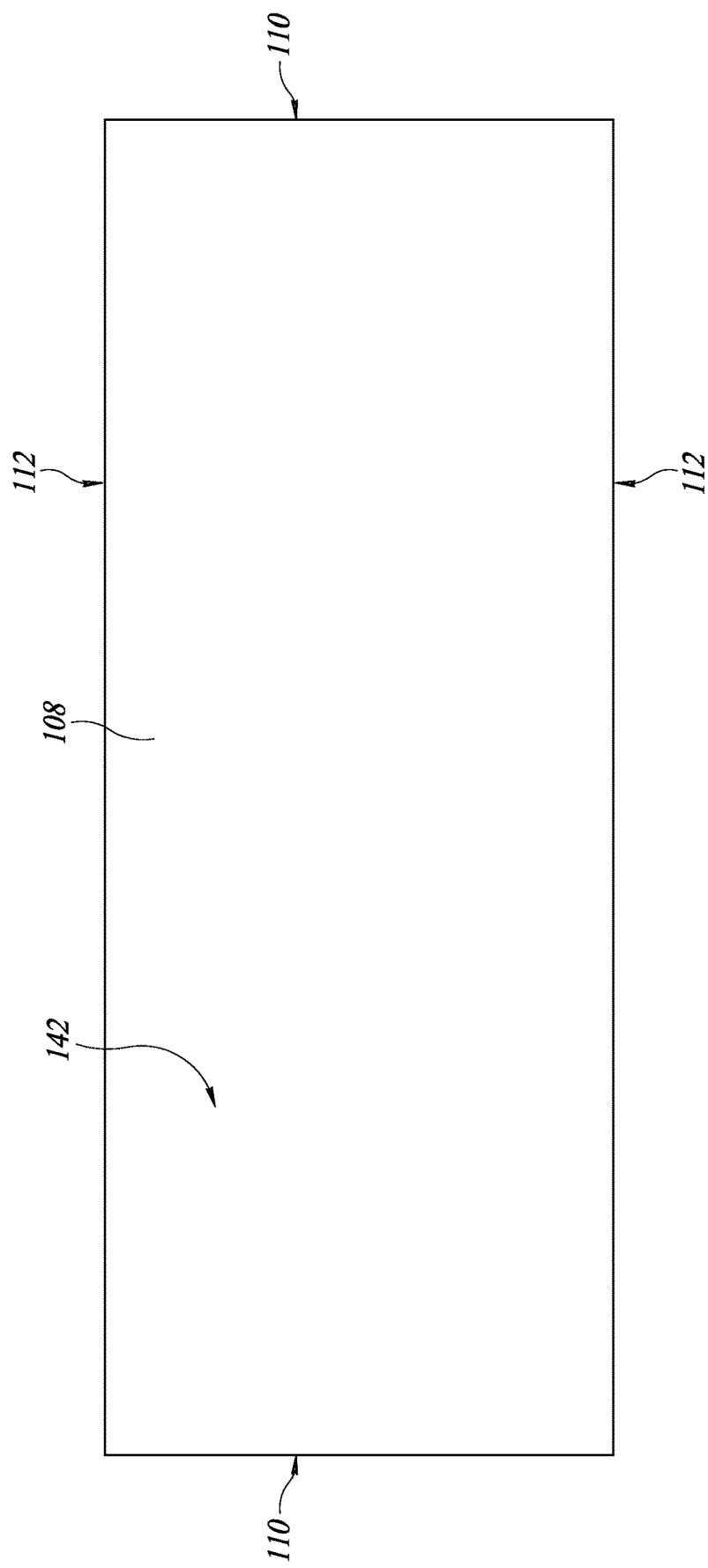
FIG. 1C is a top plan view of the embodiment of the semiconductor package as shown in FIGS. 1A and 1B.

FIG. 1B is directed to a cross-sectional view of the semiconductor package 100 taken along line 1B-1B as indicated by the dotted line across FIG. 1A. FIG. 1C is a top plan view of the semiconductor package 100 as shown in FIGS. 1A and 1B.

The semiconductor package 100 includes a die 116 in a molding compound 108 and is covered by the molding compound 108. The die 116 is on an internal surface 118 of the die pad 106. As discussed earlier, the molding compound 108 includes the sidewalls 125.

An adhesive 120 couples the die 116 to the internal surface 118 of the die pad 106. The adhesive 120 may be a glue, a die attach film (DAF), or some other suitable type of adhesive for coupling the die 116 to the internal surface 118 of the die pad 106.

The die pad 106 includes a first layer 106a, a second layer 106b, and a third layer 106c. The first layer 106a is at least partially sandwiched between the second and third layers 106b, 106c, respectively. The second layer 106b is on a surface 121 of the die pad 106 that faces away from the die 116, and the third layer 106c is on a surface 122 of the die pad 106 that faces towards the die 116. The external surface 109 of the die pad 106 is a surface of the second layer 106b that is exposed from the semiconductor package 100. The internal surface 118 of the die pad 106 is a surface of the third layer 106c that is within the semiconductor package 100. The die 116 is on the third layer 106c of the die pad 100. The first, second, and third layers 106a, 106b, 106c, respectively, may be conductive layers. The first layer 106a may be a core layer of the die pad 106, and the second and third layers 106b, 106c may be liner layers that line and extend along the first layer 106a.

As may readily be seen in FIG. 1B, ends of the second layer 106b are spaced inwardly from edges of the first layer 106a delimiting the surface 120 of the first layer 106a, and ends of the third layer 106c are spaced inwardly from edges of the first layer 106a delimiting the surface 122 of the first layer 106a. In other words, the surface 121 of the first layer 106a has a surface area greater than a surface area of the external surface 109 of the second layer 106b, and the surface 122 of the first layer 106a has a surface area greater than a surface area of the internal surface 118 of the third layer 106c.

Ones of the plurality of leads 104 include a first layer 104a, a second layer 104b, and a third layer 104c. The following discussion will be focused on the lead 104 at the left-hand side of the semiconductor package 100. However, it will be readily appreciated that the following discussion will readily apply to the other ones of the plurality of leads 104 of the semiconductor package 100.

The first layer 104a is at least partially sandwiched between the second layer 104b and the third layer 104c. The second layer 104b extends along and is on a first surface 124, a first sidewall surface 126, and on a second surface 128 of the first layer 104a of the lead 104 at the left-hand side of the semiconductor package 100. The first and second surfaces 124, 128, respectively, are transverse to the first sidewall surface 126, which extends from the first surface 124 to the second surface 128. The second surface 128 is present at the lip portion 107 of the lead 104.

The sidewall 114 of the lead 104 includes a first end surface 130 of the first layer 104a and a second end surface 132 of the second layer 104b. The first end surface 130 and the second end surface 132 are substantially coplanar and substantially flush with each other. The first end surface 130 and the second end surface 132 are substantially coplanar and substantially flush with the sidewall surface 125 of the molding compound 108 at the left-hand side of the semiconductor package 100.

The second layer 104b includes a sidewall surface 134 overlapping the first sidewall surface 126 of the first layer 104a. The sidewall surface 134 is exposed from the semiconductor package 100. The sidewall surface 134 of the second layer 104b is closer to the die 116 than the end surfaces 130, 132, respectively, of the first and second layers 104a, 104b, respectively. The sidewall surface 134 of the second layer 104b is closer to the die 116 than the sidewall surface 125 of the molding compound 108 at the left-hand side of the semiconductor package 100.

The first layer 104a of the lead 104 includes a third surface 136, a second sidewall surface 138, and a fourth surface 140. The third and fourth surfaces 136, 140 are transverse to the second sidewall surface 138, which extends from the third surface 136 to the fourth surface 140. The fourth surface 140 extends from the end surface 130 of the lead 104 to the second sidewall surface 138. The second sidewall surface 138 partially overlaps the first sidewall surface 126 of the lead 104.

The third layer 104c is on and extends along the third surface 136 of the first layer 104a. In this embodiment of the semiconductor package 100, the third layer 104c terminates before reaching the second sidewall surface 138 of the lead 104. In some embodiments, the third layer 104c may be on and extend along the second sidewall surface 138 and the fourth surface 104 such that the third layer 104c covers the second sidewall surface 138 and the fourth surface 140 as well. When the third layer 104c is covering the second sidewall surface 138 and the fourth surface 140, the third layer 104c may include an end surface exposed at the sidewall 110 of the semiconductor package 100, and the end surface may be substantially coplanar and substantially flush with the end surfaces 130, 132, respectively, of the first and second layers 104a, 104b, respectively, and the sidewall surface 125 of the molding compound 108.

The second sidewall surface 138 and the fourth surface 140 are covered by the molding compound 108, and the third surface 136 is partially covered by the molding compound 108 and partially covered by the third layer 104c. In some embodiments, when the third layer 104c is on, extends along, and covers the second sidewall surface 138 and the fourth surface 140, the molding compound 108 is on, extends along, and covers the third layer 104c present along and covering the second sidewall surface 138 and the fourth surface 140.

The first layer 104a, the second layer 104b, and the third layer 104c may be conductive layers. The first, second, and third layers 104a, 104b, 104c, respectively, of the lead 104 may be made of the same or similar conductive materials of the first, second, and third layers 106a, 106b, 106c, respectively, of the die pad 106.

An exposed or outer surface 142 of the molding compound 108 is opposite to the external surface 109 of the second layer 106b of the die pad 106. The exposed surface 142 extends between opposite ones of the first sidewalls 110 of the semiconductor package 100, and extends between opposite ones of the second sidewalls 112 of the semiconductor package 100.

A first thickness or dimension 144 of the semiconductor package 100 extends from the exposed surface 105 of the second conductive layer 104b of the lead 104 at the right-hand side of the semiconductor package 100 to the exposed surface 142 of the molding compound 108. The first thickness 144 may range from 0.3-millimeters (mm) to 1.0-mm.

A second thickness 146 of the lead 104 extends from the exposed surface 105 to an internal surface 148 of the third conductive layer 104c that faces away from the first layer 106a and the second layer 104b. The molding compound 108 is on the internal surface 148 of the third conductive layer 104c. The second thickness may range from 0.10-mm to 0.20-mm.

A third thickness 150 of the lead 104 extends from the exposed surface 105 to the fourth surface 140 of the first layer 104a of the lead 104. The third thickness 150 may range from 0.20-mm to 0.30-mm.

A fourth thickness 152 extends from the fourth surface 140 to an external surface 154 of the second conductive layer 104b of the lead 104 that faces away from the fourth surface 140 of the first layer 104a. The fourth thickness 152 may range from 0.10-mm to 0.20-mm.

The first thickness 144 of the semiconductor package 100 is greater than the second, third, and fourth thicknesses 146, 150, 152, respectively. The third thickness 150 is greater than the second and fourth thicknesses 146, 152, respectively. The second thickness 146 is greater than the fourth thickness 152. In some embodiments, the second and fourth thicknesses 146, 152 may be substantially equal to each other. In some embodiments, when the third conductive layer 104c is on, extends along, and covers the second sidewall surface 138 and the fourth surface 140, the second thickness 146 is substantially equal to the fourth thickness 152.

A fifth thickness 156 of the die pad 106 extends from the external surface 109 of the second layer 106b of the die pad 106 to the internal surface 118 of the third layer 106c of the die pad 106. The fifth thickness 156 may range from 0.10-mm to 0.20-mm. The fifth thickness 156 is substantially equal to the second thickness 146 of the lead 104.

As may readily be seen in FIGS. 1A and 1B, the die pad 106 is spaced apart and separated from the leads 104. A plurality of wires 158 have first ends present at a surface 160 of the die 116. The surface 160 may be an active surface of the die 116. The first ends are coupled to contact pads 162 of the die 116 exposed at the surface 160 of the die 116. The plurality of wires 158 include second ends opposite to the first ends that are coupled to the third conductive layers 104c of ones of the plurality of leads 104. Electrical signals may be transmitted to and from the die 116 through the plurality of leads 104 and the plurality of wires 158 such that the die 116 is in electrical communication with electrical components external to the semiconductor package 100. In other words, the die pad 106 is electrically coupled to the respective leads 104 by the plurality of wires 158 as shown in FIG. 1B.

The surface 160 of the die 116 is closer to the internal surface 118 of the die pad 106 than the fourth surface 140 of the plurality of leads 104. For example, a dimension 133 that extends from surface 160 of the die 116 to the surface 118 of the die pad 106 is less than a dimension 135 that extends from a sidewall 137 of the die 116 to the second sidewall surface 138 of the lead 104 at the right hand side of the semiconductor package to which the fourth surface 140 of the lead 104 abuts.

In some embodiments, the third thickness 150 may be substantially equal to or greater than the summation (e.g., addition) of the dimension 133 and the fifth thickness 156. For example, as shown in FIG. 1B, the third thickness 150 is greater than the summation of the dimension 133 and the fifth thickness 156.

A dimension 163 extends from the exposed surfaces 105 to the external surface 154. As shown in FIG. 1B, the dimension 163 is greater than the second thickness 146. A dimension 165 extends from the fourth surface 140 to the exposed surface 142 (e.g., outer surface). As shown in FIG. 1B, the dimension 165 is less than the third thickness 150.

Each one of the plurality of leads 104 includes a first portion 164 and a second portion 166. The lip portion 107 may be referred to as a third portion of the lead 104. Each first portion 164 extends away from the die pad 116 towards a corresponding one of the sidewalls 110 of the semiconductor package 100. Each one of the second portions extends away from a corresponding one of the first portions 164 and is transverse to the corresponding one of the first portions 164. Each one of the lip portions 107 (e.g., third portions of each one of the plurality of leads 104) extends away from a corresponding one of the second portions 166 towards the corresponding one of the sidewalls 110 of the semiconductor package 100. The lip portions 107 extend from the corresponding one of the second portions 166 to the corresponding one of the sidewalls 110 of the semiconductor package, and the lip portions 107 terminate at the corresponding one of the sidewalls 110 of the semiconductor packages at the end surfaces 130, 132, respectively, of the first and second layers 104a, 104b, respectively. The first portions 164 include portions of the first, second, and third layers 106a, 106b, 106c, respectively. The second portions 166 and the lip portions 107 include portions of the first and second layers 106a, 106b, respectively. In some embodiments, when the third conductive layer 104c covers the second sidewall surface 166 and the fourth surface 152, the lip portions 107 and the second portions 166 may include the third layer 104c as well.

Each one of the third layers 104c of the plurality of leads 104 terminates before extending to a corresponding one of the second sidewall surfaces 138 of the plurality of leads. Each one of the third layers 104c terminates at a first end 111, and a space 123 extends between the first end 111 and the sidewall surface 138. The space 123 is filled with the molding compound 108. Each one of the third layers 104c terminates before extending to a first edge 113 of a corresponding one of the first layers 104a. The third layers 104c terminate at second ends 115 on corresponding ones of the third surfaces 136. Each one of the second ends 115 is opposite to a corresponding one of the first ends 111. In some embodiments, the first ends 111 may extend to the second sidewalls 138. In some embodiments, the second ends 115 may extend to the first edges 113 of the plurality of leads 104.

Each one of the second layers 104b of the plurality of leads 104 terminates on a corresponding one of the first surfaces 124 of the plurality of leads 104. The second layer 104b terminate at third ends 117 on corresponding ones of the first surfaces 124. The third ends 117 are opposite to a corresponding one of the second end surfaces 132. The second layers 104b terminate at the third ends 117 before extending to second edges 119 of the first layers 104a.

FIGS. 2A-2E are directed to steps in a method of manufacturing the semiconductor package 100 of the present disclosure as shown in FIGS. 1A-1C. FIGS. 2A-2E are cross-sectional views of the steps in the embodiment of the method of manufacturing the semiconductor package 100, which is shown in FIGS. 1A-1C of the present disclosure.

FIG. 2A is a cross-sectional view of a leadframe 200 including a plurality of die pad portions 202 and a plurality of lead portions 204. At least one of the die pad portions 202 corresponds to the die pad 106 of the semiconductor package 100 as shown in FIGS. 1A and 1B. At least some of the lead portions 204 correspond to the plurality of leads 104 as shown in FIGS. 1A and 1B. A plurality of extension portions 206 extend from adjacent ones of the plurality of lead portions 204. Each one of a plurality of recesses 207 is aligned with and overlaps with a corresponding one of the plurality of extensions portions 206.

The leadframe 200 further includes a first layer 208, a plurality of second layers 210, a plurality of third layers 212, a plurality of fourth layers 214, and a plurality of fifth layers 216. The first, second, third, fourth, and fifth layers 208, 210, 212, 214, 216, respectively, may be made of a conductive material or a plurality of conductive materials. The first, second, third, fourth, and fifth layers 208, 210, 212, 214, 216, respectively, may have been formed by a patterning technique. For example, the patterning technique may include forming a photoresist layer, patterning the photoresist layer with a pattern, forming conductive material within the pattern in the photoresist layer, and removing the photoresist layer leaving the conductive material behind forming the first, second, third, fourth, and fifth layers 208, 210, 212, 214, 216, respectively. The photoresist layer may be formed by a deposition technique, for example, vapor deposition, sputtering, or some other type of deposition technique. The photoresist layer may be patterned by exposing the photoresist layer to a light source of natural light, a light source of ultraviolet (UV) light, or some other suitable type of light source for patterning the photoresist layer. The conductive material may be formed by an electrolytic plating technique, a chemical plating technique, or some other suitable type of plating technique for filling the pattern in the photoresist layer with the conductive material. The photoresist layer may be removed after forming the conductive material within the pattern of the photoresist layer by exposing the photoresist layer to the light source. After removing the photoresist layer, the conductive material is left behind forming the first, second, third, fourth, and fifth layers 208, 210, 212, 214, 216, respectively.

The first layer 208 corresponds to the first layer 106a of the die pad 106 and the first layers 104a of the leads 104 of the semiconductor package 100 as shown in FIG. 1B. At least one of the second layers 210 corresponds to the second layer 106b of the die pad 106 of the semiconductor package as shown in FIG. 1B. At least one of the third layers 212 corresponds to the third layer 106c of the die pad 106 of the semiconductor package 100 as shown in FIG. 1B. At least some of the fourth layers 214 correspond to the second layers 104b of the leads 104 of the semiconductor package 100 as shown in FIG. 1B. At least some of the fifth layers 216 correspond to the third layers 104c of the leads 104 of the semiconductor package 100 as shown in FIG. 1B.

After the plurality of second, third, fourth and fifth layers 210, 212, 214, 216 have been formed on the first layer 208, a plurality of recesses 218 may be formed by performing an etching step in which selected locations of the first layer 208 between adjacent ones of the third layers 212 and the fifth layers 216 are exposed to an etchant, which may be a chemical etchant. The etching step may be a chemical etching technique utilizing the chemical etchant. The plurality of recesses 218 extend into the first layer 208 and terminate within the first layer 208 such that the plurality of recesses 218 do not entirely extend through the first layer 208 of the leadframe 200. In some embodiments, the plurality of recesses 218 may be formed after the plurality of second, third, fourth, and fifth layers 210, 212, 214, 216.

In some embodiments, the plurality of recesses 218 may be formed before forming the second, third, fourth, and fifth layers 210, 212, 214, 216 on the first layer 208. In some embodiments, at least some of the second, third, fourth, and fifth layers 210, 212, 214, 216 may be formed on the first layer 208 before the plurality of recesses 218 are formed. In other words, the second, third, fourth, and fifth layers 210, 212, 214, 216 as well as forming the plurality of recesses 218 may be performed in various orders.

The first layer 208 is a core layer of the leadframe 200 and the second, third, fourth, and fifth layers 210, 212, 214, 216 are layers that line respective surfaces of the first layer 208 of the leadframe 200. The first layer 208 may extend continuously along the leadframe 200 from a first end (not shown) of the leadframe 200 to a second end (not shown) of the leadframe 200 opposite to the first end (not shown) of the leadframe 200.

The second layers 210 are at first regions 220 of the first layer 208 overlapping the die pad portions 202, and the third layers 212 at second regions 222 of the first layer 208 overlapping the die pad portions 202. Each one of the first and second regions 220, 222, respectively, corresponds to at least one of the die pad portions 202. The first and second regions 220, 222, respectively, may be surfaces of first layer 208 at the die pad portions 202. At least one of the first regions 220 corresponds to the surface 122 of the first layer 106a of the die pad 106 of the semiconductor package 100 as shown in FIG. 1B. At least one of the second regions 222 corresponds to the surface 121 of the first layer 106a of the die pad 106 of the semiconductor package 100 as shown in FIG. 1B.

The fourth layers 214 are on third regions 224, fourth regions 226, and fifth regions 228 of the first layer 208 of the leadframe 200. Each one of the third, fourth, and fifth regions 224, 226, 228, respectively, correspond to at least one the leads portions 204. The third, fourth, and fifth regions 224, 226, 228, respectively, may be surfaces of corresponding ones of the leads 104. The third, fourth, and fifth regions 224, 226, 228, respectively, overlap a corresponding one of the lead portions 204. At least some of the third regions 224 correspond to the first surfaces 124 of the first layers 104a of the leads 104 of the semiconductor package 100 as shown in FIG. 1B. At least some of the fourth regions 226 correspond to the first sidewall surfaces 126 of the first layers 104a of the leads 104 of the semiconductor package 100 as shown in FIG. 1B. At least some of the fifth regions 228 correspond to the second surfaces 128 of the first layers 104a of the leads 104 of the semiconductor package 100 as shown in FIG. 1B. The third, fourth, and fifth regions 224, 226, 228, respectively, overlap corresponding ones of the plurality of lead portions 204 and extend along surfaces of the first layer 208 at the plurality of lead portions 204.

The third regions 224 are between adjacent ones of the plurality of extension portions 206 and the plurality of recesses 218. The fourth layers 214 extend along the third regions 224 and terminate before extending to overlap with ones of the plurality of recesses 218 such that surface areas 230 of the first layer 208 remain exposed. The exposed surface areas 230 overlap corresponding ones of the plurality of recesses 218.

The fourth layers 214 further extend along corresponding ones of the fourth regions 226, which extend from the third regions 224 to the fifth regions 228. The fifth regions 228 may be surfaces of the extension portions 206 that are covered by the fourth layers 214 that partially delimits the recesses 207, and the fourth regions 226 may be sidewall surfaces of the lead portions 204 that are coved by the fourth layers 214 that partially delimits the recesses 207.

The fourth layers 214 completely cover the corresponding ones of the fourth regions 226 and the fifth regions 228. The fourth layers 214 extend into the recesses 207, and the forth layers 214 extend along and on the fourth and fifth regions 226, 228, respectively, partially filling the recesses 207 such that the fourth layers 214 delimit the recesses 207. The fourth layers 214 extend continuously along at least two of the third regions 224, at least two of the fourth regions 226, and at least one of the fifth regions 228.

The fifth layers 216 extend along sixth regions 231 of the first layer 208 of the leadframe 200. Each one of the sixth regions 231 overlap a corresponding one of the plurality of lead portions 204. Each of the sixth regions 231 is opposite to a corresponding one of the third regions 224. Each of the sixth regions 231 is between an adjacent one of the plurality of recesses 218 and an adjacent one of a plurality of sidewall regions 232 of the lead portions 204. The sidewall regions 232 may be sidewall surfaces of the lead portions 204. At least some of the sidewall regions 232 correspond to the second sidewall surfaces 138 of the first layers 104a of the leads 104 of the semiconductor package 100 as shown in FIG. 1B. The fifth layers 216 extend along the sixth regions 231 and terminate before reaching the adjacent one of the plurality of recesses 218 and terminate before reaching the adjacent one of the sidewall regions 232. In some embodiments, the fifth layers 216 may extend along the sixth regions 231, the sidewall regions 232, and seventh regions 234 such that the fifth layers 216 completely cover the sidewall regions 232 and the seventh regions 234. For example, each fifth layer 216 may completely cover at least one of the seventh regions 234 and may completely cover at least two of the sidewall regions 232. Each one of the seventh regions 234 is opposite to a corresponding one of the fifth regions 228.

Each one of the plurality of recesses 207 extends along a corresponding one of a plurality of saw lines 235 (e.g., kerf lines). The leadframe 200 will be singulated by a sawing tool or a cutting tool (e.g., saw, laser, or some other suitable type of singulation tool or device) along these saw lines 235, which are represented by the vertical dotted lines as shown in FIG. 2A. Each one of the plurality of recesses 207 has a dimension 209 that extends from opposite sidewall surfaces of a corresponding one of the fourth layers 214 that each delimit a corresponding one of the plurality of recesses 207.

After the second, third, fourth, and fifth layers 210, 212, 214, 216 have been formed on the first layer 208 of the leadframe 200 and the plurality of recesses 218 have been formed, a plurality of die 236 are coupled to corresponding ones of the die pad portions 202 by utilizing a plurality of adhesive portions 238 as shown in FIG. 2B. At least one of the plurality of die 236 corresponds to the die 116 of the semiconductor package 100. At least one of the adhesive portions 238 corresponds to the adhesive 120 of the semiconductor package 100.

To couple the plurality of die 236 to the die pad portions 202, a plurality of adhesive portions 238 may be formed by depositing an adhesive onto each one of the plurality of die pad portions 202, and the adhesive is deposited onto each one of the third layers 212. For example, the adhesive may be injected by an injection tool that forms a glob of adhesive on each one of the third layers 212. After the globs of adhesive have been deposited onto each one of the plurality of third layers 212, the plurality of die 236 may be placed onto the globs of adhesive by a pick and place machine. By placing the plurality of die 236 onto the globs of adhesive, the globs of adhesive may spread out, coupling each one of the plurality of die 236 to a corresponding one of the die pad portions 202. The adhesive is allowed to cure such that the plurality of adhesive portions 238 are formed adhering each one of the plurality of die 236 to a corresponding one of the plurality of die pad portions 202.

After the plurality of die 236 have been coupled to the die pad portions 202 by the adhesive portions 238, each one of the plurality of die 236 are coupled to corresponding ones of the plurality of lead portions 204 by forming a plurality of electrical wires 240. At least some of the plurality of electrical wires 240 correspond to the electrical wires 158 of the semiconductor package 100 as shown in FIG. 1B.

The plurality of electrical wires 240 may be formed by a bond and stitch technique. Each one of the plurality of electrical wires 240 has a first end coupled to a corresponding contact pad 242 of a corresponding one of the plurality of die 236 and a second end coupled to a corresponding one of the plurality of fifth layers 216 present at a corresponding one of the plurality of lead portions 204. The plurality of electrical wires 240 electrically couple the contact pads 242 of the plurality of die to the plurality of lead portions 204.

Figure 2C:
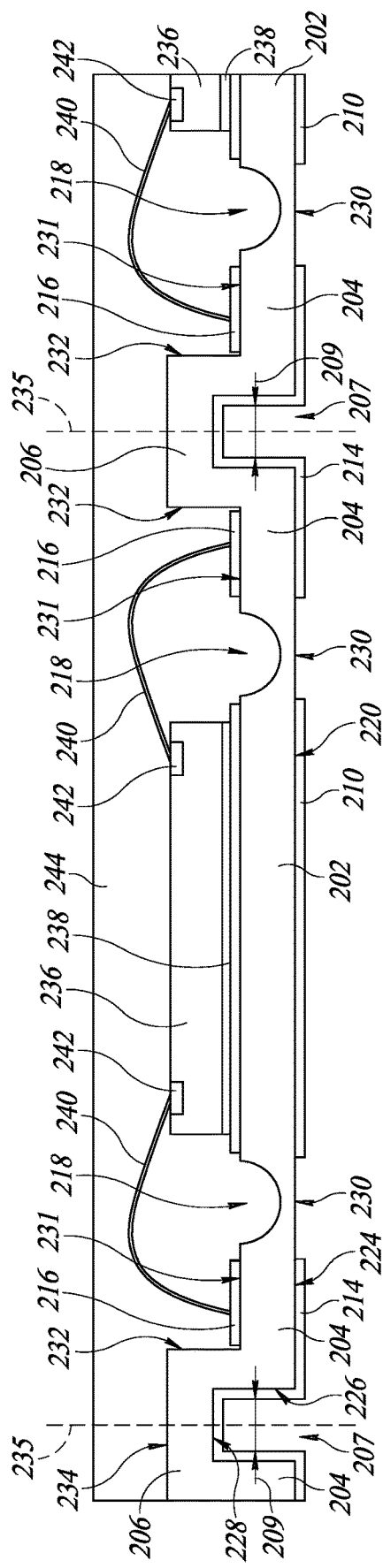

After the plurality of die 236 have been coupled to the plurality of die pad portions 202 and the plurality of electrical wires 240 have been formed, a molding compound 244 is formed on the leadframe 200 as shown in FIG. 2C. The molding compound 244 is formed to cover the plurality of die 236, cover the plurality of electrical wires 240, and fill the plurality of recesses 218 in the first layer 208 of the leadframe 200. The molding compound 244 surrounds the electrical wires 240 such that the electrical wires 240 are encased within the molding compound 244.

The molding compound 244 may be formed by placing a molding tool on the seventh regions 234 of the extension portions 206 of the leadframe 200. After the molding tool has been placed, the molding compound 244 may be injected between the molding tool and the leadframe 200 such that the molding compound fills a cavity between the molding tool and the leadframe 200. As the molding compound 244 is injected between the molding tool and the leadframe 200, the molding compound 244 covers the plurality of die 236, the electrical wires 240, and fills the plurality of recesses 218. The layer of the molding compound 244 corresponds to the molding compound 108 of semiconductor package 100.

Figure 2D:
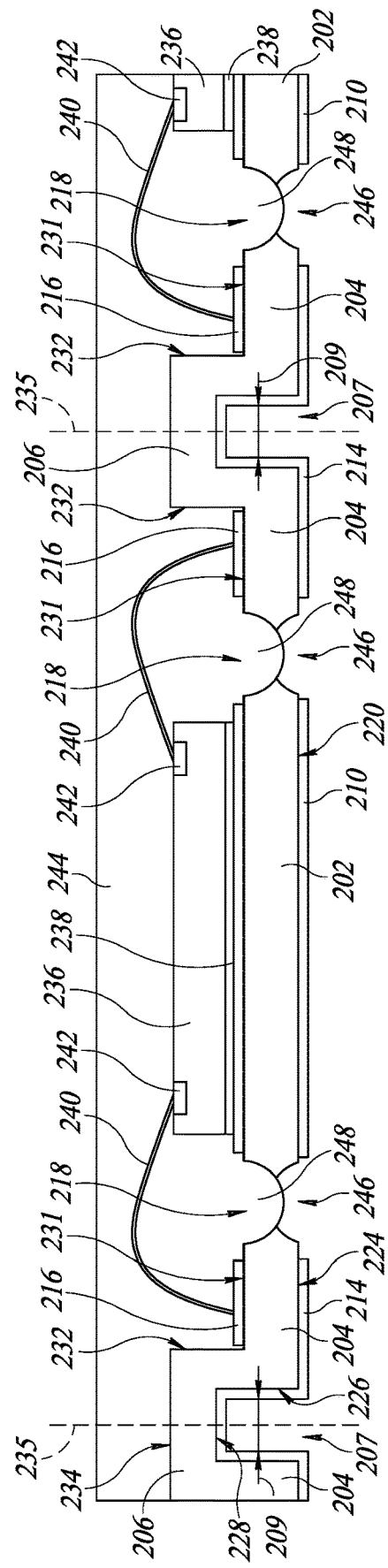

After the molding compound 244 has been formed covering the plurality of die 236 and the plurality of wires 240, openings 246 are formed in the leadframe 200 exposing portions 248 of the molding compound 244 and separating the plurality of lead portions 204 from the plurality of die pad portions 202 as shown in FIG. 2D.

The openings 246 may be formed by carrying out an etching step. For example, a photoresist material may be applied to and patterned on the exposed surfaces of the leadframe not covered by the molding compound 244 in the previous step as shown in FIG. 2D. After the forming and patterning of the photoresist layer, the first layer 208 of the leadframe 200 is exposed to a chemical etchant such that the openings 246 are formed by removing portions of the first layer 208 of the leadframe 200. Removing these portions of the leadframe 200 forming the openings 246 results in exposing portions 248 of the molding compound 244. The formation of the openings 246 results in the plurality of lead portions 204 being separated from the plurality of die pad portions 202 by the openings 246. In other words, the die pad portions 202 are physically separated from the lead portions 204 by forming the openings 246.

Figure 2E:
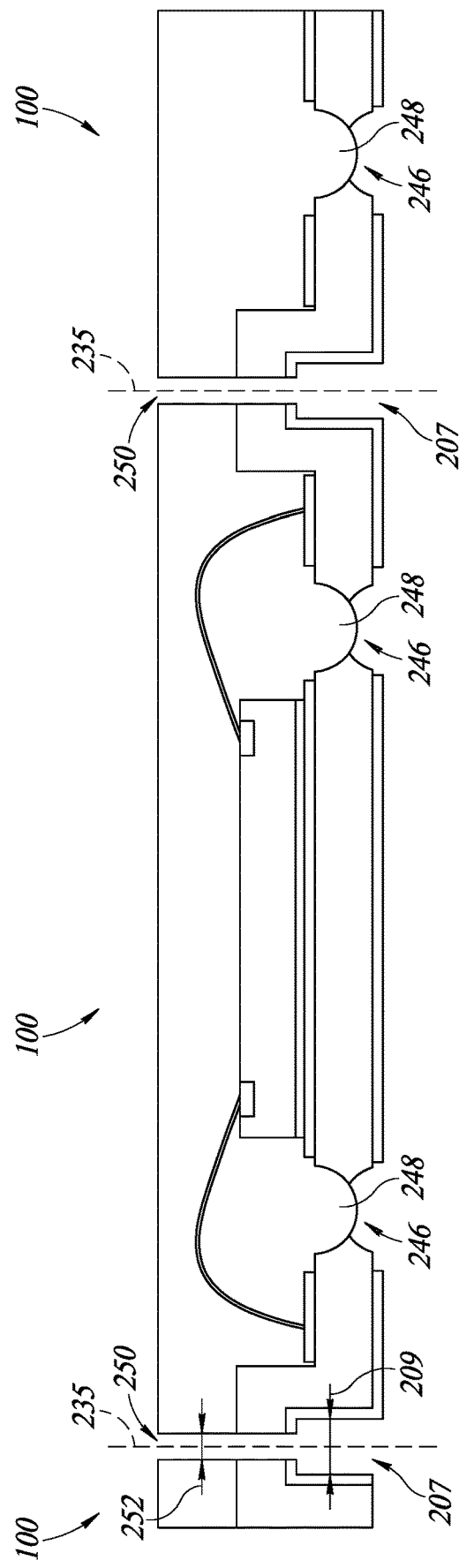

After the openings 246 have been formed, a singulation step is carried out in which individual ones of the semiconductor package 100 are formed as shown in FIG. 2E. A singulation tool (e.g., sawing tool, cutting tool, laser tool, or any other suitable type of singulation tool) is utilized to cut along the saw lines 235 such that individual ones of the semiconductor packages 100 are formed. The singulation tool makes cuts 250 along the saw lines 235. Each one of the cuts 250 has a dimension 252 that extends between adjacent ones of the individual ones of the semiconductor packages 100. The dimension 252 is less than the dimension 209 of the plurality of recesses 207 such that the lip portions 107 of the plurality of leads 104 of the semiconductor package 100 as shown in FIG. 1B are formed.

The exposed surfaces 105, the sidewall surfaces 134, the first end surface 130, and the second end surface 132, and the external surface 154 may be referred to as outer surfaces of external surfaces. The first surfaces 124, the first sidewall surfaces 126, and the second surfaces 128 of the first layer 104*a* of the leads 104 may be referred to as outer or external surfaces of the first layer 104*a*. The third surface 136, the second sidewall surface 138 and the fourth surface 140 of the first layer 104*a* of the leads 104 may be referred to as inner or internal surfaces of the first layer 104*a* of the leads 104. The internal surface 148 of the third conductive layer 104*c* may be referred to as an inner surface.

A device may be summarized as including: a leadframe including: a die pad; a lead spaced apart from the die pad, the lead having: a first layer including: a first outer surface, an outer sidewall surface transverse to the first outer surface, and a second outer surface transverse to the first outer sidewall surface; a first inner surface opposite to the first outer surface, an inner sidewall surface opposite to the outer sidewall surface, and a second inner surface opposite to the second outer surface; and a first end surface transverse to the second outer surface and the second inner surface; a second layer on the first outer surface, the outer sidewall surface, and the second outer surface, the second layer including: a second end surface coplanar with the first end surface of the first layer; a third layer on the first inner surface, the third layer terminating at a first end spaced apart from the inner sidewall surface; and a space extending from the first end of the third layer and the inner sidewall surface; a molding compound covering first inner surface, the inner sidewall surface, and the second inner surface, and the third layer, the molding compound filling the space and covering the end of the third layer.

The molding compound may include a sidewall surface coplanar with the first end surface of the first layer and the second end surface of the second layer. The device of may include a die coupled to the die pad by an adhesive, the die including a contact pad at an active surface of the die; and an electrical wire having a first end and a second end opposite to the first end, the first end is coupled to the contact pad, and the second end is coupled to the third layer. The first layer may be a conductive layer; the second layer may be a conductive layer; and the third layer may be a conductive layer. The first layer may include an inner edge that partially delimits the first inner surface and an outer edge that partially delimits the first outer surface; the third layer may include a second end opposite to the first end of the third layer, the second end of the third layer is spaced apart from the inner edge, and the third layer terminates at the second end; and the second layer may include an end on the first outer surface at which the second layer terminates, the end of the second layer is spaced apart from the second edge. The device may include a die on a surface of the die pad, the die having an active surface closer to the surface of the die pad than the second inner surface of the lead.

A method may be summarized as including: forming a plurality of layers on a first layer of a leadframe, forming the plurality of layers including: forming a second layer on a first region along a first side of the first layer of a leadframe; forming a third layer on a second region along a second side of the first layer of the leadframe, the second region being opposite to the first region and overlapping the first region; forming a fourth layer on a third region, a fourth region, and a fifth region along the second side of the first layer of the leadframe and extending into a first recess of the leadframe partially filling the first recess with the fourth layer, the fourth region being transverse to the third region and the fifth region, the fourth region extending from the third region to the fifth region; and forming a fifth layer on a sixth region on the first side of the first layer of the leadframe, the sixth region being opposite to the third region and overlapping the third region, the fifth layer being spaced apart from the second layer; forming a second recess into the first layer of the leadframe between the first layer and the fifth layer; coupling a die by an adhesive to the second layer; after coupling the die to the second layer, forming a molding compound entirely covering the first side of the first layer of the leadframe, covering the die, covering the fifth layer, and filling the second recess; and after forming the molding compound, singulating a portion of the first layer, a portion the fourth layer, an extension of the leadframe extending between a first lead portion and a second lead portion of the leadframe, and the molding compound aligned with and overlapping the first recesses forming a semiconductor package.

The method may further include, after coupling the die to the second layer, coupling a first end of an electrical wire to a contact pad at an active surface of the die and coupling a second end of the electrical wire opposite to the first end of the electrical wire to the fifth layer.

The method may further include, after forming the molding compound, removing portions of the leadframe separating the first lead portion and the second lead portion from ones of a plurality of die pad portions of the leadframe.

Singulating the portion of the first layer, the portion of the fourth layer, and the extension of the leadframe may include separating the first lead portion from the second lead portion. Singulating the portion of the first layer, the portion of the fourth layer, and the extension of the leadframe may include: forming a sidewall surface of the molding compound; forming a first end surface of the first layer of the first lead portion substantially coplanar with the sidewall surface of the molding compound; and forming a second end surface of the fourth layer of the first lead portion substantially coplanar with the sidewall surface of the molding compound and the first end surface of the first layer. Entirely covering the first side of the first layer of the leadframe may include: entirely covering a surface of the extension of the leadframe facing away from the first recess of the leadframe.

A device may be summarized as including: a leadframe including: a die pad having a surface; a first lead having: a first layer including: a first portion extending in a first direction; a second portion extending away from the first portion in a second direction transverse to the first portion; a third portion extending away from the second portion in the first direction; a first internal surface and a first external surface extending in the first direction, the first portion being between the first internal surface and the first external surface; a second internal surface and a second external surface extending in the second direction, the second portion being between the second internal surface and the second external surface; a third internal surface and a third external surface extending in the first direction, the third portion being between the third internal surface and the third external surface; and a first end surface extending in the first direction from the third internal surface to the third external surface; a die coupled to the surface of the die pad by an adhesive; and a molding compound covering the first internal surface, the second internal surface, and the third internal surface, the molding compound including a first sidewall surface substantially coplanar with the first end surface of the first layer of the first lead.

The first lead may further include: a second layer on the first internal surface and extending along the first internal surface towards the second internal surface, the second layer terminating at an end before reaching the second internal surface; and a space between the end of the second layer and the second internal surface.

The molding compound may fill the space between the end of the second layer and the second internal surface. The first lead may further include: a third layer on the first external surface, the second external surface, and the third external surface, the third layer extending along the first external surface, the second external surface, and the third external surface, the third layer having a second end surface at the first end surface of the first layer, the second end surface being substantially coplanar with the first end surface and the first sidewall surface of the molding compound.

The device may further include an electrical wire coupling the second layer of the first lead to a contact pad at an active surface of the die.

The molding compound may have an outer surface facing away from the first lead and extending in the first direction, the outer surface overlapping and covering the third internal surface. The first sidewall surface of the molding compound may extend in the second direction from the third internal surface of the first lead to the outer surface of the molding compound.

The device may further include a second lead opposite to the first lead, the second lead including: a first layer including: a first portion extending in a first direction; a second portion extending away from the first portion in a second direction transverse to the first portion; a third portion extending away from the second portion in the first direction; a first internal surface and a first external surface extending in the first direction, the first portion being between the first internal surface and the first external surface; a second internal surface and a second external surface extending in the second direction, the second portion being between the second internal surface and the second external surface; a third internal surface and a third external surface extending in the first direction, the third portion being between the third internal surface and the third external surface; and a first end surface extending in the first direction from the third internal surface to the third external surface; wherein the molding compound further includes a second sidewall surface opposite to the first sidewall surface and a third surface extending from the first sidewall surface to the second sidewall surface, the third surface overlapping the respective third internal surfaces of the first and second leads, respectively, and the second sidewall surface being substantially coplanar with the first end surface of the second lead.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
  a leadframe including:
    a die pad; and
    a lead spaced apart from the die pad, the lead having:
      a first layer including:

a first outer surface, an outer sidewall surface transverse to the first outer surface, and a second outer surface transverse to the first outer sidewall surface;

a first inner surface opposite to the first outer surface, an inner sidewall surface opposite to the outer sidewall surface, and a second inner surface opposite to the second outer surface; and a first end surface transverse to the second outer surface and the second inner surface;

a second layer on the first outer surface, the outer sidewall surface, and the second outer surface, the second layer including:

a second end surface coplanar with the first end surface of the first layer;

a third layer on the first inner surface, the third layer terminating at a first end spaced apart from the inner sidewall surface; and a space extending from the first end of the third layer and the inner sidewall surface;

a molding compound covering first inner surface, the inner sidewall surface, and the second inner surface, and the third layer, the molding compound filling the space and covering the end of the third layer.

2. The device of claim 1, wherein the molding compound includes a sidewall surface coplanar with the first end surface of the first layer and the second end surface of the second layer.

3. The device of claim 1, further comprising:
a die coupled to the die pad by an adhesive, the die including a contact pad at an active surface of the die; and
an electrical wire having a first end and a second end opposite to the first end, the first end is coupled to the contact pad, and the second end is coupled to the third layer.

4. The device of claim 1, wherein:
the first layer is a conductive layer;
the second layer is a conductive layer; and
the third layer is a conductive layer.

5. The device of claim 1, wherein:
the first layer includes an inner edge that partially delimits the first inner surface and an outer edge that partially delimits the first outer surface;
the third layer includes a second end opposite to the first end of the third layer, the second end of the third layer is spaced apart from the inner edge, and the third layer terminates at the second end; and
the second layer includes an end on the first outer surface at which the second layer terminates, the end of the second layer is spaced apart from the second edge.

6. The device of claim 1, further comprising a die on a surface of the die pad, the die having an active surface closer to the surface of the die pad than the second inner surface of the lead.

7. A method, comprising:
forming a plurality of layers on a first layer of a leadframe, forming the plurality of layers including:
forming a second layer on a first region along a first side of the first layer of a leadframe;
forming a third layer on a second region along a second side of the first layer of the leadframe, the second region being opposite to the first region and overlapping the first region;
forming a fourth layer on a third region, a fourth region, and a fifth region along the second side of the first layer of the leadframe and extending into a first recess of the leadframe partially filling the first recess with the fourth layer, the fourth region being transverse to the third region and the fifth region, the fourth region extending from the third region to the fifth region; and
forming a fifth layer on a sixth region on the first side of the first layer of the leadframe, the sixth region being opposite to the third region and overlapping the third region, the fifth layer being spaced apart from the second layer;
forming a second recess into the first layer of the leadframe between the first layer and the fifth layer;
coupling a die by an adhesive to the second layer;
after coupling the die to the second layer, forming a molding compound entirely covering the first side of the first layer of the leadframe, covering the die, covering the fifth layer, and filling the second recess; and
after forming the molding compound, singulating a portion of the first layer, a portion the fourth layer, an extension of the leadframe extending between a first lead portion and a second lead portion of the leadframe, and the molding compound aligned with and overlapping the first recesses forming a semiconductor package.

8. The method of claim 7, further comprising, after coupling the die to the second layer, coupling a first end of an electrical wire to a contact pad at an active surface of the die and coupling a second end of the electrical wire opposite to the first end of the electrical wire to the fifth layer.

9. The method of claim 7, further comprising, after forming the molding compound, removing portions of the leadframe separating the first lead portion and the second lead portion from ones of a plurality of die pad portions of the leadframe.

10. The method of claim 7, wherein singulating the portion of the first layer, the portion of the fourth layer, and the extension of the leadframe includes separating the first lead portion from the second lead portion.

11. The method of claim 7, wherein singulating the portion of the first layer, the portion of the fourth layer, and the extension of the leadframe includes:
forming a sidewall surface of the molding compound;
forming a first end surface of the first layer of the first lead portion substantially coplanar with the sidewall surface of the molding compound; and
forming a second end surface of the fourth layer of the first lead portion substantially coplanar with the sidewall surface of the molding compound and the first end surface of the first layer.

12. The method of claim 7, wherein entirely covering the first side of the first layer of the leadframe includes:
entirely covering a surface of the extension of the leadframe facing away from the first recess of the leadframe.

13. A device, comprising:
a leadframe including:
a die pad having a surface;
a first lead having:
a first layer including:
a first portion extending in a first direction;
a second portion extending away from the first portion in a second direction transverse to the first portion;
a third portion extending away from the second portion in the first direction;

a first internal surface and a first external surface extending in the first direction, the first portion being between the first internal surface and the first external surface;

a second internal surface and a second external surface extending in the second direction, the second portion being between the second internal surface and the second external surface;

a third internal surface and a third external surface extending in the first direction, the third portion being between the third internal surface and the third external surface;

a first end surface extending in the first direction from the third internal surface to the third external surface;

a second layer on the first internal surface and extending along the first internal surface towards the second internal surface, the second layer terminating at an end before reaching the second internal surface; and a space between the end of the second layer and the second internal surface;

a die coupled to the surface of the die pad by an adhesive; and a molding compound covering the first internal surface, the second internal surface, and the third internal surface, the molding compound including a first sidewall surface substantially coplanar with the first end surface of the first layer of the first lead.

14. The device of claim 13, wherein the molding compound fills the space between the end of the second layer and the second internal surface.

15. The device of claim 14, wherein the first lead further includes:

a third layer on the first external surface, the second external surface, and the third external surface, the third layer extending along the first external surface, the second external surface, and the third external surface, the third layer having a second end surface at the first end surface of the first layer, the second end surface being substantially coplanar with the first end surface and the first sidewall surface of the molding compound.

16. The device of claim 13, further comprising an electrical wire coupling the second layer of the first lead to a contact pad at an active surface of the die.

17. The device of claim 13, wherein the molding compound has an outer surface facing away from the first lead and extending in the first direction, the outer surface overlapping and covering the third internal surface.

18. The device of claim 17, wherein the first sidewall surface of the molding compound extends in the second direction from the third internal surface of the first lead to the outer surface of the molding compound.

19. The device of claim 17, further comprising:

a second lead opposite to the first lead, the second lead including:

a first layer including:

a first portion extending in a first direction;

a second portion extending away from the first portion in a second direction transverse to the first portion;

a third portion extending away from the second portion in the first direction;

a first internal surface and a first external surface extending in the first direction, the first portion being between the first internal surface and the first external surface;

a second internal surface and a second external surface extending in the second direction, the second portion being between the second internal surface and the second external surface;

a third internal surface and a third external surface extending in the first direction, the third portion being between the third internal surface and the third external surface; and a first end surface extending in the first direction from the third internal surface to the third external surface;

wherein the molding compound further includes a second sidewall surface opposite to the first sidewall surface and a third surface extending from the first sidewall surface to the second sidewall surface, the third surface overlapping the respective third internal surfaces of the first and second leads, respectively, and the second sidewall surface being substantially coplanar with the first end surface of the second lead.

20. The device of claim 13, further comprising a third layer on the first external surface, the second external surface, and the third external surface, the third layer extending along the first external surface, the second external surface, and the third external surface, the third layer having a second end surface at the first end surface of the first layer, the second end surface being substantially coplanar with the first end surface and the first sidewall surface of the molding compound.

* * * * *